(12) United States Patent
Park et al.

(10) Patent No.: US 10,877,184 B2
(45) Date of Patent: Dec. 29, 2020

(54) GLASS MEMBER FOR DISPLAY DEVICE, METHOD OF FABRICATING THE GLASS MEMBER, AND DISPLAY DEVICE INCLUDING THE GLASS MEMBER

(71) Applicant: Samsung Display Co., Ltd., Yongin-si (KR)

(72) Inventors: Jeongwoo Park, Yongin-si (KR); Seungho Kim, Asan-si (KR); Jong-Hoon Yeum, Seoul (KR); Seung Kim, Seongnam-si (KR); Junehyoung Park, Seoul (KR); Hoikwan Lee, Suwon-si (KR); Woojin Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 239 days.

(21) Appl. No.: 15/952,119

(22) Filed: Apr. 12, 2018

(65) Prior Publication Data
US 2019/0011605 A1   Jan. 10, 2019

(30) Foreign Application Priority Data

Jul. 7, 2017   (KR) .......................... 10-2017-0086685

(51) Int. Cl.
  *C03C 15/00* (2006.01)
  *G03F 7/20* (2006.01)
  (Continued)

(52) U.S. Cl.
  CPC ................ *G02B 1/14* (2015.01); *C03C 15/00* (2013.01); *C03C 17/001* (2013.01);
  (Continued)

(58) Field of Classification Search
  CPC ....... C03C 15/00; C03C 17/001; C03C 17/32; G02B 1/14; G03F 7/2002; G03F 7/2022;
  (Continued)

(56) References Cited

U.S. PATENT DOCUMENTS 9,488,857 B2    11/2016  Bornstein et al.
2009/0045752 A1* 2/2009  Azuma .................. H01L 51/56
                                             315/169.3

(Continued)

FOREIGN PATENT DOCUMENTS

KR    10-1104271 B1    1/2012
KR    10-1324837 B1    11/2013
                (Continued)

*Primary Examiner* — John A McPherson
(74) *Attorney, Agent, or Firm* — Lewis Roca Rothgerber Christie LLP

(57) ABSTRACT

A glass member for a display device, a method of fabricating a glass member, and a display device including a glass member are provided. A method of fabricating a glass member for a display device includes: preparing a glass substrate including a first surface, a second surface facing the first surface, and a side surface connecting the first surface to the second surface; forming a protection layer on the side surface to cover a portion of the side surface; and etching a portion of the glass substrate exposed by the protection layer.

9 Claims, 10 Drawing Sheets

(51) Int. Cl.
   *G02B 1/14*   (2015.01)
   *C03C 17/00*  (2006.01)
   *C03C 23/00*  (2006.01)
   *H05K 5/00*   (2006.01)
   *C03C 17/32*  (2006.01)
   *G02F 1/1333* (2006.01)

(52) U.S. Cl.
   CPC .......... *C03C 17/328* (2013.01); *C03C 23/002* (2013.01); *G03F 7/2002* (2013.01); *H05K 5/0017* (2013.01); *C09K 2323/033* (2020.08); *G02F 2001/133302* (2013.01); *G02F 2001/133331* (2013.01); *H05K 2203/1377* (2013.01)

(58) Field of Classification Search
   CPC ........ G02F 2001/133331; G02F 2001/133302; G02F 1/133305; G06F 3/041; G06F 3/0412; G06F 2203/04102

USPC ................. 430/320, 321; 216/24, 46, 97
   See application file for complete search history.

(56) References Cited

U.S. PATENT DOCUMENTS

| | | | |
|---|---|---|---|
| 2012/0052302 | A1 | 3/2012 | Matusick et al. |
| 2015/0301390 | A1* | 10/2015 | Kim .................. G02F 1/133305 29/825 |
| 2017/0351135 | A1* | 12/2017 | Kim ..................... C03B 23/023 |

FOREIGN PATENT DOCUMENTS

| | | |
|---|---|---|
| KR | 10-2013-0135842 A | 12/2013 |
| KR | 10-1489241 B1 | 2/2015 |
| KR | 10-1620375 B1 | 5/2016 |
| KR | 10-2016-0106725 A | 9/2016 |
| WO | WO 2016/104826 A1 * | 6/2016 |

* cited by examiner

GLASS MEMBER FOR DISPLAY DEVICE, METHOD OF FABRICATING THE GLASS MEMBER, AND DISPLAY DEVICE INCLUDING THE GLASS MEMBER

CROSS-REFERENCE TO RELATED APPLICATION

This application claims priority to and the benefit of Korean Patent Application No. 10-2017-0086685, filed on Jul. 7, 2017 in the Korean Intellectual Property Office, the entire content of which is hereby incorporated by reference.

BACKGROUND

1. Field

Aspects of embodiments of the present disclosure relate to a glass member for a display device, a method of fabricating the glass member, and a display device including the glass member.

2. Description of the Related Art

Electronic products, such as mobile communication terminals, digital cameras, notebook computers, monitors, and television sets, include a display device configured to display an image.

The display device includes a display panel, which is configured to generate and display an image, and a window panel, which is provided on the display panel and is used to protect the display panel. Various display panels, such as a liquid crystal display (LCD) device, an organic light emitting display (OLED) device, an electrowetting display (EWD) device, a plasma display panel (PDP) device, and an electrophoresis display (EPD) device, have been developed as the display panel. The display panel may be configured to have a touch sensing function.

The window panel is attached to a top surface of the display panel. That is, the window panel is located on a propagating path of light transmitted from the display panel to an observer. In addition, the window panel is used to protect internal functional layers from an external impact, and, for this reason, the window panel has the highest risk of breakage from the external impact. Furthermore, in a case in which the window panel is used for a flexible display device, the window panel should have a very small thickness so as to realize a foldable property, and this makes the window panel more vulnerable to the external impact.

SUMMARY

Some embodiments of the inventive concept provide a glass member with an improved mechanical strength property, a method of fabricating the same, and a display device including the glass member.

According to some embodiments of the inventive concept, a method of fabricating a glass member for a display device may include: preparing a glass substrate including a first surface, a second surface facing the first surface, and a side surface connecting the first surface to the second surface; forming a protection layer on the side surface to cover a portion of the side surface; and etching a portion of the glass substrate exposed by the protection layer.

In some embodiments, the forming of the protection layer may include coating the side surface with a curable material, curing a portion of the curable material by irradiating ultraviolet light, and removing a remaining portion of the curable material, except for the cured portion of the curable material.

In some embodiments, the curing of the portion of the curable material may include placing a mask with an opening on the side surface coated with the curable material, and irradiating the ultraviolet light to cure a portion of the curable material exposed by the opening.

In some embodiments, the opening may have a width from 10 μm to 200 μm.

In some embodiments, the method may further include removing the protection layer.

In some embodiments, the method may further include irradiating ultraviolet light to the cured portion of the curable material to re-cure the cured portion of the curable material.

In some embodiments, the curable material may include 30-40 wt % of an acrylic monomer, 30-40 wt % of an acrylic oligomer, and 20-30 wt % of a photoinitiator.

In some embodiments, the protection layer may have a width from 10 μm to 200 μm, and the protection layer may have a height from 10 μm to 100 μm.

In some embodiments, the glass substrate may have a thickness from 10 μm to 200 μm.

According to some embodiments of the inventive concept, a display device may include a display panel configured to display an image and a window member provided on the display panel.

In some embodiments, the window member may include a glass substrate, which includes a front surface displaying the image, and a rear surface facing the front surface, and a side surface connecting the front surface to the rear surface, and a protection layer which is arranged to be in contact with the side surface of the glass substrate and to have substantially a same width as a thickness of the glass substrate.

In some embodiments, the thickness of the glass substrate may be from 10 μm to 200 μm.

In some embodiments, the protection layer includes an acrylic curable material.

In some embodiments, the width of the protection layer may be from 10 μm to 200 μm, and the protection layer may have a height from 10 μm to 100 μm.

In some embodiments, the front surface may have a rectangular shape when viewed in a plan view, and the side surface may include first to fourth side surfaces, which are respectively connected to four sides of the front surface. The protection layer may be arranged on the first side surface and the second side surface facing the first side surface and may not be arranged on the third side surface and the fourth side surface.

In some embodiments, the protection layer may be arranged on all of the first to fourth side surfaces.

According to some embodiments of the inventive concept, a display device may include a display panel configured to display an image, and a window member provided on the display panel. The display panel may include a glass substrate including a front surface to display the image, a rear surface facing the front surface, and a side surface connecting the front surface and the rear surface; a pixel layer on the front surface of the glass substrate; and a protection layer arranged to be in contact with the side surface of the glass substrate and to have substantially a same width as a thickness of the glass substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
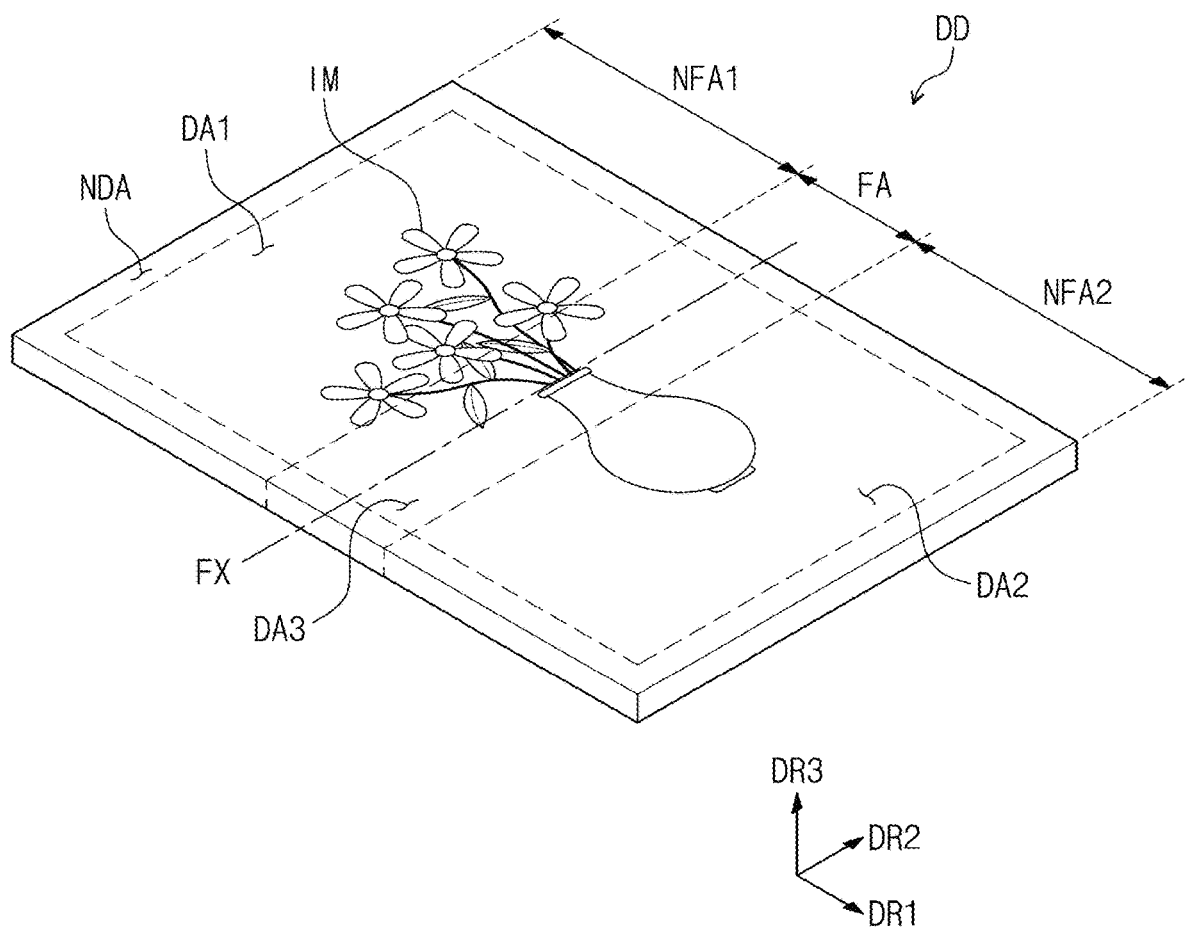
FIG. 1 is a perspective view schematically illustrating a display device according to some embodiments of the inventive concept.

These drawing figures are intended to illustrate the general characteristics of methods, structure, and/or materials utilized in some example embodiments and to supplement the written description provided below. These drawings, however, may not be to scale and may not precisely reflect the precise structural or performance characteristics of any given embodiment, and should not be interpreted as defining or limiting the range of values or properties encompassed by example embodiments. For example, the relative thicknesses and positioning of components, layers, regions, and/or structural elements may be reduced or exaggerated for clarity. The use of similar or identical reference numbers in the various drawings is intended to indicate the presence of a similar or identical element or feature.

DETAILED DESCRIPTION

Some example embodiments of the inventive concepts will be described more fully with reference to the accompanying drawings, in which some example embodiments are shown. Embodiments of the inventive concepts may, however, be embodied in many different forms and should not be construed as being limited to the example embodiments set forth herein; rather, these example embodiments are provided so that this disclosure will be thorough and complete and will fully convey the inventive concepts to those of ordinary skill in the art. In the drawings, the thicknesses of layers and regions may be exaggerated for clarity. Like reference numerals in the drawings denote like elements, and thus repeated description may be omitted.

It is to be understood that when an element is referred to as being "connected" or "coupled" to another element, it can be directly connected or coupled to the other element, or one or more intervening elements may be present. In contrast, when an element is referred to as being "directly connected" or "directly coupled" to another element, there are no intervening elements present. Other words used to describe a relationship between elements or layers should be interpreted in a like fashion (e.g., "between" versus "directly between," "adjacent" versus "directly adjacent," "on" versus "directly on"). Like numbers indicate like elements throughout. As used herein the term "and/or" includes any and all combinations of one or more of the associated listed items.

It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a "first" element, component, region, layer, or section discussed below could be termed a "second" element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the drawing figures. It is to be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of embodiments of the inventive concepts. As used herein, the singular forms "a," "an," and "the" are intended to include the plural forms as well, unless the context clearly indicates otherwise. It is to be further understood that the terms "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which embodiments of the inventive concepts belong. It is to be further understood that terms, such as those defined in commonly-used dictionaries, should be interpreted as having a meaning that is consistent with their meaning in the context of the relevant art and are not to be interpreted in an idealized or overly formal sense unless expressly so defined herein.

Figure 2:
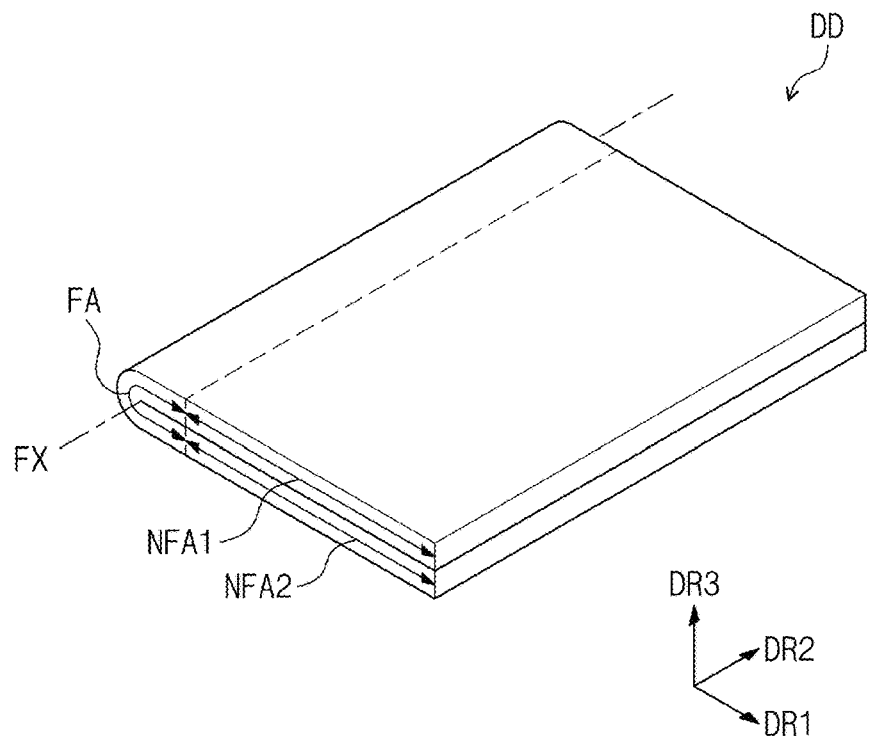
FIG. 2 is a perspective view illustrating another state of the display device of FIG. 1.

FIGS. 1 and 2 are perspective views schematically illustrating a display device DD according to some embodiments of the inventive concept. In the present embodiment, a foldable display device, which is one type of flexible display devices, will be described as an example of the display device DD. However, the inventive concept is not limited thereto, and the inventive concept may be applied to any of various display devices, such as curved, bendable, rollable, and stretchable display devices. Furthermore, although not shown, the display device DD may be used for large-sized electronic devices (e.g., television sets and outdoor billboards) or small- or medium-sized electronic devices (e.g., cellular phones, personal computers, notebook computers, personal digital assistants, car navigation systems, game machines, portable electronic devices, wristwatch-style electronic devices, and cameras).

As shown in FIGS. 1 and 2, the display device DD may have a display surface that is parallel to a first direction DR1 and a second direction DR2 and is used to display an image IM. A third direction DR3 is a direction normal to the display surface. The third direction DR3 may be used to differentiate a front or top surface of each element from a back or bottom surface. However, directions indicated by the first to third directions DR1, DR2, and DR3 may be relative concepts, and in certain embodiments, they may be changed to indicate other directions.

The display device DD may include a folding region FA, which is folded along a folding axis FX when the display device DD is folded, and a first non-folding region NFA1 and a second non-folding region NFA2, which are not folded. Although the display device DD is illustrated to be folded along the folding axis FX parallel to the second direction DR2, the inventive concept is not limited thereto.

As shown in FIG. 1, the display surface of the display device DD may be divided into a plurality of regions. For example, the display device DD may include first to third display regions DA1, DA2, and DA3 (herein, a display region DA) and a non-display region NDA, depending on whether the image IM is displayed. The display region DA may be used to display an image, and the non-display region NDA may not be used to display an image. The image IM is shown in FIG. 1, as an example, to be displayed in the form of a vase. The display region DA may have, for example, a rectangular shape. The non-display region NDA may be provided to enclose or surround the display region DA.

The display device DD may be folded along the folding axis FX in such a way that the first display region DA1 of the first non-folding region NFA1 faces the second display region DA2 of the second non-folding region NFA2. Although not shown, the display device DD may be folded along the folding axis FX in such a way that the first display region DA1 of the first non-folding region NFA1 and the second display region DA2 of the second non-folding region NFA2 are exposed to the outside.

Figure 3:
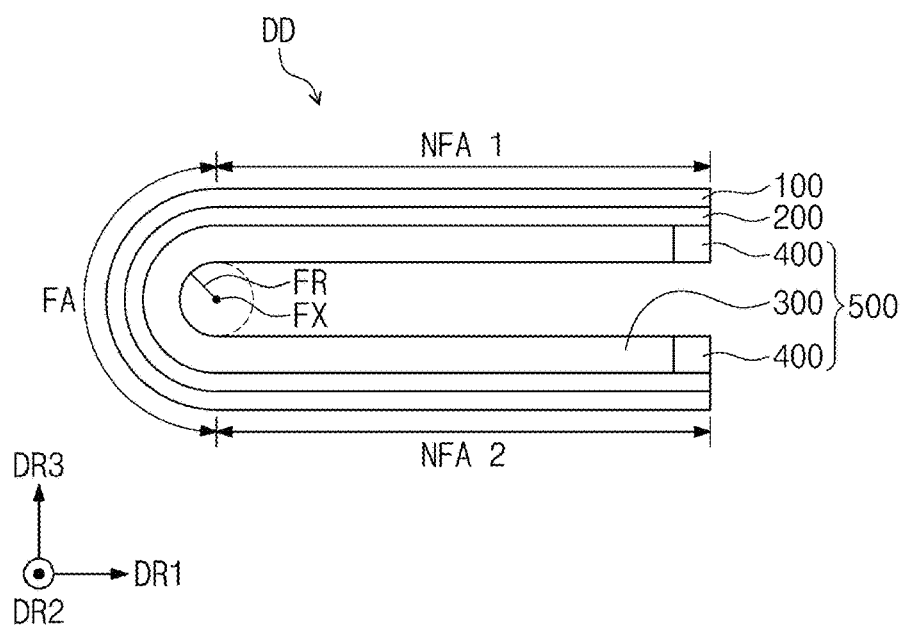
FIGS. 3 and 4 are enlarged sectional views of a display device according to some embodiments of the inventive concept.
Figure 4:
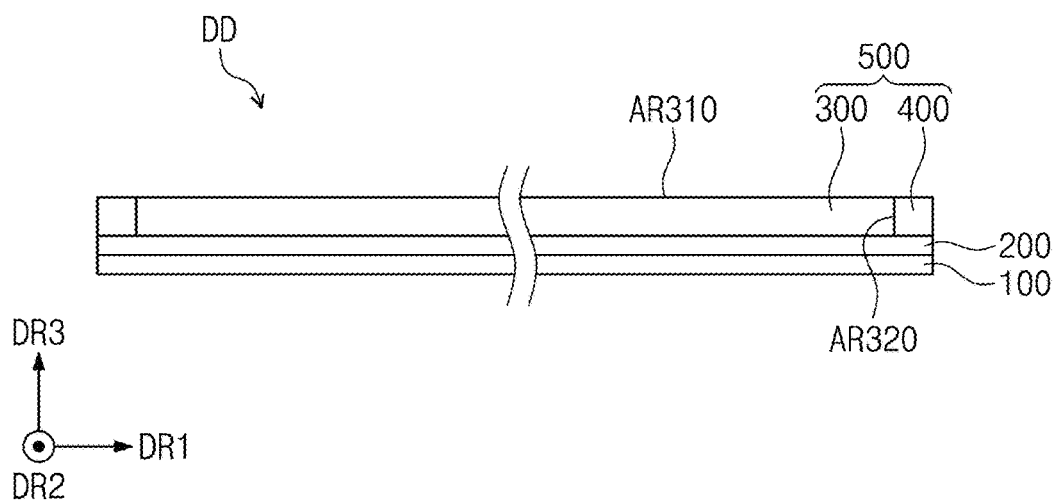

FIGS. 3 and 4 are enlarged sectional views of the display device DD according to some embodiments of the inventive concept.

As shown in FIG. 3, the display device DD may be folded in such a way that different display regions thereof face toward each other, but the inventive concept is not limited to this example. For example, the display device DD may be folded in such a way that the different display regions are exposed to the outside.

The display device DD may be folded in such a way that the folding region FA is folded at a curvature radius (e.g., a specific curvature radius) FR along the folding axis FX as shown in FIG. 3, or may be unfolded in such a way that the folding region FA is positioned at a same level as that of the first non-folding region NFA1 and the second non-folding region NFA2.

The display device DD may include a display panel 100, a touch panel 200, and a window member 500.

The display panel 100 may be provided in the form of a plate. The display panel 100 may have a rectangular shape, when viewed in a plan view, but the inventive concept is not limited to a specific shape or a specific size of the display panel 100. If image data is input to the display panel 100, the display panel 100 may display an image (e.g., see IM of FIG. 1) based on the image data. The display panel 100 may be a liquid crystal display panel, an organic light emitting display panel, an electrophoresis display panel, or an electrowetting display panel, for example, but the inventive concept is not limited to a specific kind of the display panel 100. The display panel 100 may be configured to have a flexible property.

The touch panel 200 may be provided on a front surface of the display panel 100. However, the inventive concept is not limited to a specific position of the touch panel 200 relative to the display panel 100. The touch panel 200 may be a contact-type or non-contact-type touch panel. The touch panel 200 may be configured to obtain coordinate information on a position to which an input is applied. The touch panel 200 may be configured to have a flexible property.

In some embodiments, the display panel 100 and the touch panel 200 may be combined with each other by an optically clear adhesive (OCA) film. However, the inventive concept is not limited thereto, and, in another embodiment, for example, the OCA film may be omitted. As an example, the display panel 100 and the touch panel 200 may be successively fabricated in such a way that the touch panel 200 is directly placed on the display panel 100 without the OCA film.

The window member 500 may be provided on the touch panel 200. The description that follows will refer to an example in which the window member 500 is positioned on a top surface of the touch panel 200, but the inventive concept is not limited thereto. The window member 500 may be placed on the touch panel 200 to protect the display panel 100 and the touch panel 200.

The window member 500 may include a glass substrate 300 and a protection layer 400.

The glass substrate 300 may include a front surface AR310, on which an image to be seen by a user is displayed, a rear surface facing the front surface AR310, and a side surface AR320 connecting the front and rear surfaces to each other. The glass substrate 300 may have a rectangular shape, when viewed in a plan view, but the inventive concept is not limited to a specific shape or a specific size of the glass substrate 300. The glass substrate 300 may be substantially transparent. For example, the glass substrate 300 may be configured to allow most of light incident thereto to pass therethrough.

The glass substrate 300 may have a thickness in a range from 10 μm to 200 μm and, in some embodiments, from 10 μm to 100 μm. In the case in which the thickness of the glass substrate 300 is within the above range, the glass substrate 300 may be easily bent or deformed with a high degree of freedom and thus may be used to realize a flexible display device. By contrast, in a case in which the glass substrate 300 has a thickness larger than 200 μm, the glass substrate 300 may suffer from a low degree of freedom in deformation thereof and thus may be hardly applied for a flexible display device.

The protection layer 400 may be arranged on the side surface AR320 of the glass substrate 300. The glass substrate 300 may have a plurality of the side surfaces AR320, and the protection layer 400 may be arranged to completely cover at least one of the side surfaces AR320 of the glass substrate 300. If the protection layer 400 has a shape capable of completely covering a desired one of the side surfaces AR320 of the glass substrate 300, the inventive concept is not limited to a specific planar shape of the protection layer 400. For example, the protection layer 400 may have a rectangular shape, as exemplarily illustrated in the drawings, or a semicircular shape.

The protection layer 400 may be provided on the side surface AR320 of the glass substrate 300 to absorb impact to be exerted on the glass substrate 300, thereby protecting the glass substrate 300 from the impact. Since the protection layer 400 is positioned on the side surface AR320 of the glass substrate 300, the glass substrate 300 may have the same thickness as the protection layer 400, in an etching step of the glass substrate 300 to be described below. The protection layer 400 may have a width in a range from 10 μm to 200 μm (i.e. substantially a same width as the thickness of the glass substrate 300) and may have a height in a range from 10 μm to 100 μm.

The protection layer 400 may include a curable material or a plurality of different curable materials. The curable material may be a material that does not react with an etching solution to be described below. For example, the curable material may be an acid-resistant material that does not react with strong acid or hydrofluoric acid. In some embodiments, the curable material may be an acrylic hardener, but the inventive concept is not limited thereto. The acrylic hardener may be an acrylic monomer, an acrylic oligomer, or a mixture of an acrylic monomer and an acrylic oligomer. In some embodiments, the curable material may contain an acrylic monomer, an acrylic oligomer, a photoinitiator, and an additive agent. In some embodiments, the curable material may contain an acrylic monomer (30-40 wt %), an acrylic oligomer (30-40 wt %), and a photoinitiator (20-30 wt %), but the inventive concept is not limited thereto.

The acrylic monomer may be isobornyl acrylate, n-octyl acrylate, tetrahydrofuryl acrylate, 4-hydroxybutyl acrylate, or a mixture containing one or two compounds of the above, but the inventive concept is not limited thereto. The content of the acrylic monomer in the total curable material may be in a range from 30 wt % to 40 wt %. When the content of the acrylic monomer is within the above range, the curable material may be properly cured by an exposure process.

The acrylic oligomer may be an oligomer, in which 2-6 acrylate groups are contained. The acrylic oligomer may be urethane acrylate oligomer, polyester acrylate oligomer, epoxy acrylate oligomer, silicone acrylate oligomer, acrylic acrylate oligomer, melamine acrylate oligomer, or a mixture containing one or two compounds of the above, but the inventive concept is not limited thereto. The content of the acrylic oligomer in the total curable material may be in a range from 30 wt % to 40 wt %. When the content of the acrylic oligomer is within the above range, the curable material may be properly cured, and the protection layer formed thereby may have suitable strength and flexibility.

The photoinitiator may be a typical photocurable photoinitiator known in the art. For example, the photoinitiator may include triazine-based, acetophenone-based, benzophenone-based, thioxanthone-based, benzoin-based, phosphorus-based, and oxime-based materials, or mixtures thereof, but the inventive concept is not limited thereto. The content of the photoinitiator in the total curable material may be in a range from 20 wt % to 30 wt %. When the content of the photoinitiator is within the above range, the curable material may be sufficiently cured by the exposure process, and it may be possible to prevent or substantially prevent deterioration of transmittance, which may be caused by an unreacted portion of the photoinitiator remaining after the photocuring process.

In addition to the aforementioned materials, the curable material may further include a solvent and additive agent as needed. The additive agent may include, for example, photo-sensing enhancing agents, photo-sensing suppressing agents, polymerization inhibitors, leveling agents, wettability improvers, surfactants, plasticizers, ultraviolet light absorbents, antioxidants, inorganic fillers, or various additive agents known in the art.

Figure 5:
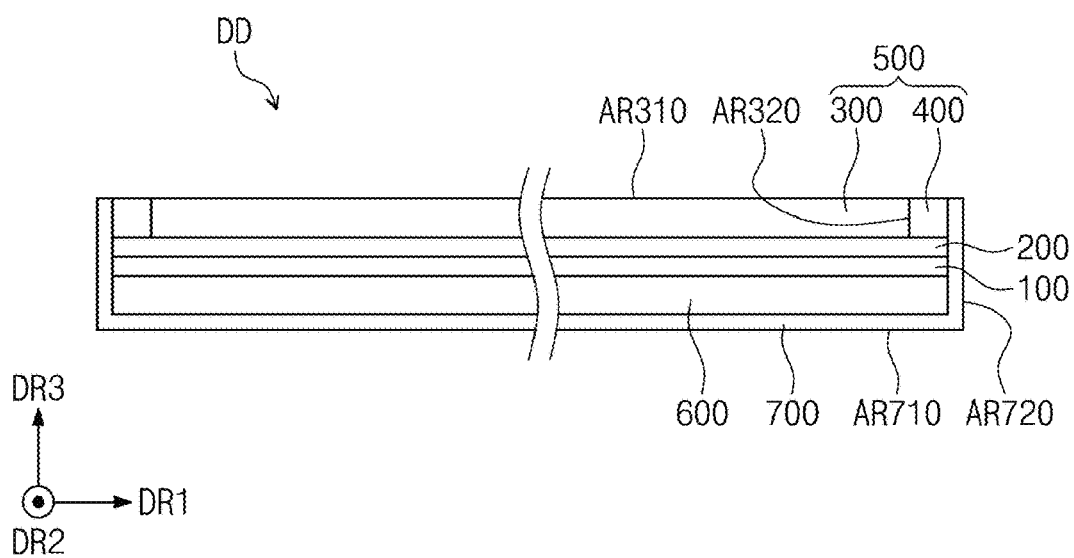
FIGS. 5 and 6 are enlarged sectional views of a portable display device, in which a display device according to some embodiments of the inventive concept is combined with a frame.

FIG. 5 is an enlarged sectional view illustrating the display device DD that is combined with a frame 700.

The frame 700 may include a bottom portion AR710 and a sidewall portion AR720. The bottom portion AR710 and the sidewall portion AR720 may connected to each other to define an internal space. The display panel 100 may be placed in the internal space.

As shown in FIG. 5, the display device DD may further include the frame 700 provided to enclose the side surface of the window member 500. For example, the protection layer 400 of the window member 500 may be in contact with the sidewall portion AR720 of the frame 700. The frame 700 may be combined with the window member 500, thereby protecting internal components from an external impact.

The bottom portion AR710 may be parallel to a plane defined by the first direction DR1 and the second direction DR2. The bottom portion AR710 may be overlapped with at least the display panel 100, when viewed in a plan view. An area of the bottom portion AR710 may be larger than that of the display panel 100.

The sidewall portion AR720 may be continuously connected to opposite edges of the bottom portion AR710 in the third direction DR3. The sidewall portion AR720 may extend in the third direction DR3, thereby defining a thickness of the display device DD. When the frame 700 is in the combined state, the sidewall portion AR720 may enclose an edge region of the display panel 100.

The display device DD may further include additional components 600, which are provided in an internal space thereof. For example, the display device DD may further include components for supplying an electric power to the display panel 100, for stably combining the window member 500 to the display panel 100, and for stably combining the display panel 100 to the frame 700. The inventive concept is not limited thereto, and the components provided in the display device DD may be variously changed.

Figure 6:
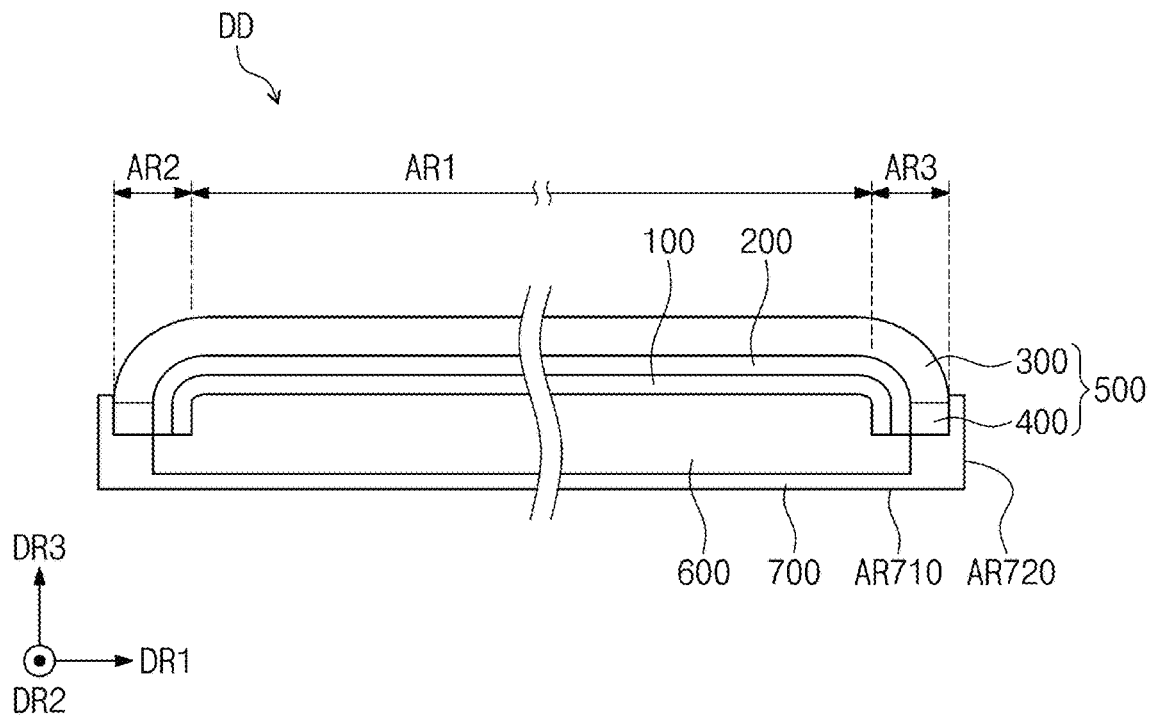

FIG. 6 is an enlarged sectional view illustrating the display device DD that is combined with the frame 700. As shown in FIG. 6, each of the display panel 100, the touch panel 200, and the window member 500 may have a curved surface.

According to some embodiments of the inventive concept, the display device DD may be configured to display an image in various directions through a curved region. Accordingly, the display device DD may provide a variety of usage environments to a user.

As shown in FIG. 6, the window member 500 of the display device DD may have a shape that is downwardly curved from a plane defined by the first and second directions DR1 and DR2. Although FIG. 6 illustrates an example in which two end portions of the window member 500, which are opposite to each other in the first direction DR1, are bent, the inventive concept is not limited thereto. For example, in some embodiments, one of the two end portions of the window member 500 may be bent.

The window member 500 may include a first region AR1, which is parallel to the plane defined by the first and second directions DR1 and DR2, and a second region AR2 and a third region AR3, which are downwardly bent from the first region AR1. The second region AR2 and the third region AR3 may be parallel to both of the second and third directions DR2 and DR3. The first region AR1 may be arranged between the second region AR2 and the third region AR3 in the first direction DR1. For example, the second region AR2 and the third region AR3 may be connected to two opposite ends of the first region AR1 in the first direction DR1.

Except for its curved shape, the window member 500 shown in FIG. 6 may be configured to have substantially the same features as those of the window member 500 shown in FIG. 5. Thus, a detailed description of the window member 500 will be omitted.

The display panel 100 and the touch panel 200 may be provided between the window member 500 and the frame 700. The display panel 100 and the touch panel 200 may have a shape that is downwardly curved from the plane defined by the first and second directions DR1 and DR2.

The frame 700 may be provided below the display panel 100. The frame 700 may be combined with the window member 500 and may be used to partially define an outer appearance the display device DD and to protect internal components. The frame 700 may have a shape allowing the frame 700 to be combined with the display panel 100 having various shapes and allowing the display panel 100 and the additional components 600 to be stably contained in the display device DD.

According to some embodiments of the inventive concept, the display device DD may include the window member 500 with a curved shape and, thus, it may be possible to stably protect the display panel 100 and other electric components from an external impact. In addition, the window member 500 may have a sufficiently high mechanical strength, even when its shape is variously changed, and, thus, it may be possible to realize the display device DD with good reliability.

Herein, a display device DD according to other embodiments of the inventive concept will be described with reference to FIG. 7.

Figure 7:
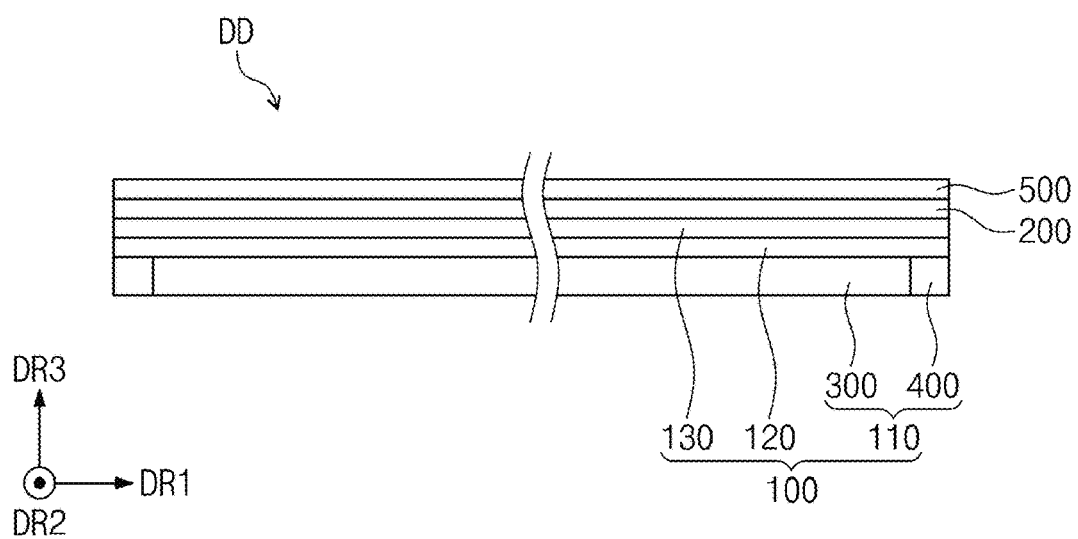
FIG. 7 is an enlarged sectional view illustrating a display device according to other embodiments of the inventive concept.

FIG. 7 is an enlarged sectional view illustrating the display device DD according to other embodiments of the inventive concept. In the present embodiment, the display device DD may be configured to include a display panel 100, a touch panel 200, and a window member 500.

The display panel 100 may include a glass substrate 300, a protection layer 400 placed on a side surface of the glass substrate 300, a pixel layer 120, and an encapsulation layer 130.

The glass substrate 300 may include a display region, which is used to display an image, and a non-display region, which is provided adjacent to the display region but is not used to display an image. A plurality of pixel regions may be defined in the display region.

The glass substrate 300 may include a front surface, which is used to display an image, a rear surface facing the front surface, and a side surface connecting the front and rear surfaces to each other. The glass substrate 300 may have a rectangular shape, when viewed in a plan view, but the inventive concept is not limited to a specific shape or a specific size of the glass substrate 300. The glass substrate 300 may be substantially transparent. For example, the glass substrate 300 may be configured to allow most of light incident thereto to pass therethrough.

The glass substrate 300 may have a thickness in a range from 10 µm to 200 µm and, in some embodiments, from 10 µm to 100 µm. In the case in which the thickness of the glass substrate 300 is within the above range, the glass substrate 300 may be easily bent or deformed with a high degree of freedom and thus may be used to realize a flexible display device. By contrast, in a case in which the glass substrate 300 has a thickness larger than 200 µm, the glass substrate 300 may suffer from a low degree of freedom in deformation thereof and thus may be hardly applied for a flexible display device.

The protection layer 400 may be arranged on the side surface of the glass substrate 300. The glass substrate 300 may have a plurality of the side surfaces, and the protection layer 400 may be arranged to completely cover at least one of the side surfaces of the glass substrate 300. If the protection layer 400 has a shape capable of completely covering a desired one of the side surfaces of the glass substrate 300, the inventive concept is not limited to a specific planar shape of the protection layer 400. For example, the protection layer 400 may have a rectangular shape, as exemplarily illustrated in the drawings, or a semicircular shape.

The protection layer 400 may be provided on the side surface of the glass substrate 300 to absorb impact to be exerted on the glass substrate 300, thereby protecting the glass substrate 300 from the impact. Since the protection layer 400 is positioned on the side surface of the glass substrate 300, the glass substrate 300 may have a same thickness as that of the protection layer 400, in an etching step of the glass substrate 300 to be described below. The protection layer 400 may have a width in a range from 10 µm to 200 µm (i.e. substantially a same width as the thickness of the glass substrate 300) and may have a height in a range from 10 µm to 100 µm.

The protection layer 400 may include a curable material or a plurality of different curable materials. The curable material may be the same as that described above, and for convenience in description, a further description thereof will be omitted.

A barrier layer (not shown) may be provided between the glass substrate 300 and the pixel layer 120 to prevent or substantially prevent an external contamination material, such as moisture or oxygen, from passing through the glass substrate 300 and from being infiltrated into the organic light emitting element.

The pixel layer 120 may be provided between the glass substrate 300 and the encapsulation layer 130. The pixel layer 120 may include a plurality of gate lines, a plurality of data lines, and a plurality of pixels. The gate lines and the data lines may be provided to cross each other and may be electrically disconnected from each other.

Each of the pixels may be provided in a corresponding one of the pixel regions. Each of the pixels may be connected to a corresponding one of the gate lines and a corresponding one of the data lines and may be used to display an image. Each of the pixels may be configured to display one of red, green, and blue colors. However, the inventive concept is not limited thereto, and, for example, each of the pixels may be configured to display a color (e.g., white), other than the red, green, and blue colors.

The pixel may include a switching transistor, a driving transistor, a storage capacitor, and an organic light emitting element.

The encapsulation layer 130 may be provided on the pixel layer 120. The encapsulation layer 130 may be provided to cover the organic light emitting element. The encapsulation layer 130 may be a multi-layered member including an organic layer and an inorganic layer. However, the inventive concept is not limited thereto, and the encapsulation layer 130 may include a substrate, which is formed of glass or a plastic material, and a sealing member, which is in contact with the substrate and encloses the organic light emitting element.

The touch panel 200 may be provided on a front surface of the display panel 100. The touch panel 200 may be directly formed on the display panel 100 or may be attached to the display panel 100, such as using an adhesive material. The touch panel 200 may be a contact-type or non-contact-type touch panel. The touch panel 200 may be configured to obtain coordinate information on a position to which an input is applied. The touch panel 200 may be configured to have a flexible property.

The window member 500 may be positioned on the touch panel 200. The description that follows will refer to an example in which the window member 500 is positioned on a top surface of the touch panel 200, but the inventive concept is not limited thereto. The window member 500 may be placed on the touch panel 200 to protect the display panel 100 and the touch panel 200.

Figure 8:
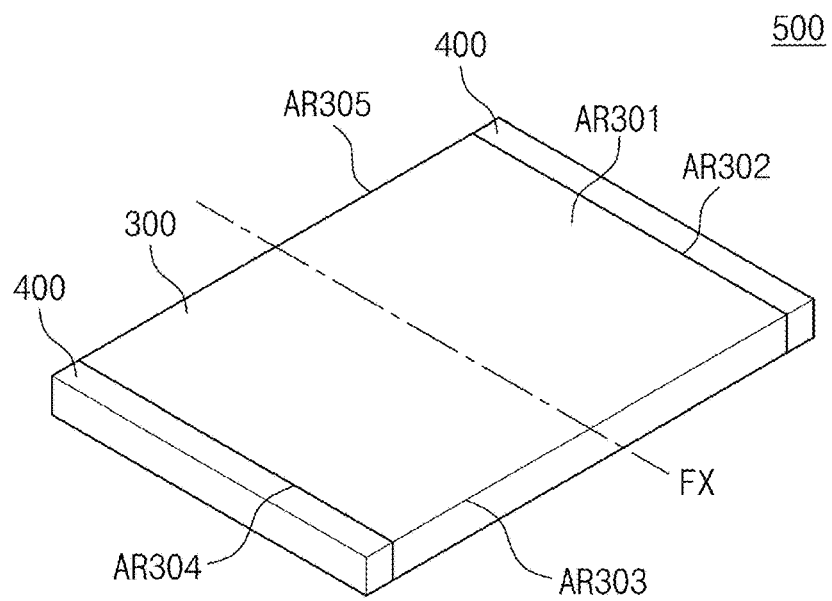
FIGS. 8 and 9 are enlarged perspective views illustrating a glass member according to some embodiments of the inventive concept.
Figure 9:
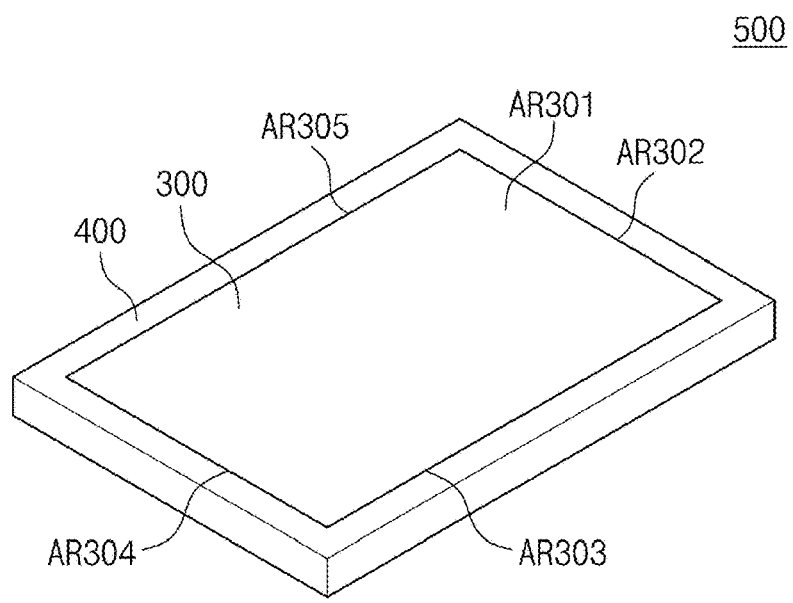

FIGS. 8 and 9 are enlarged perspective views illustrating a window member according to some embodiments of the inventive concept.

As shown in FIGS. 8 and 9, the window member 500 may include the glass substrate 300 and the protection layer 400. The glass substrate 300 may include a front surface AR301, on which an image to be seen by a user is displayed, a rear surface facing the front surface AR301, and a side surface connecting the front and rear surfaces to each other. The glass substrate 300 is illustrated to have a rectangular shape, when viewed in a plan view, but the inventive concept is not limited to a specific shape or a specific size of the glass substrate 300. The front surface AR301 may have a rectangular shape, when viewed in a plan view, and the side surface may include first to fourth side surfaces AR302, AR303, AR304, and AR305 which are respectively connected to four sides of the front surface AR301.

Here, as shown in FIG. 8, the protection layer 400 may be provided on a first side surface AR302 and a second side surface AR304 which are opposite to each other. The protection layer 400 may not be provided on a third side surface AR303 and a fourth side surface AR305. Although FIG. 8 illustrates an example in which the protection layer 400 is provided on the side surfaces parallel to the folding axis FX, the protection layer may be provided on other side surfaces that are not parallel to the folding axis FX.

As shown in FIG. 9, the protection layer 400 may be provided on all of the first to fourth side surfaces AR302, AR303, AR304, and AR305. As described above, the protection layer 400 may be provided on the side surface of the glass substrate 300 to absorb impact to be exerted on the glass substrate 300, thereby protecting the glass substrate 300 from the impact.

Figure 10:
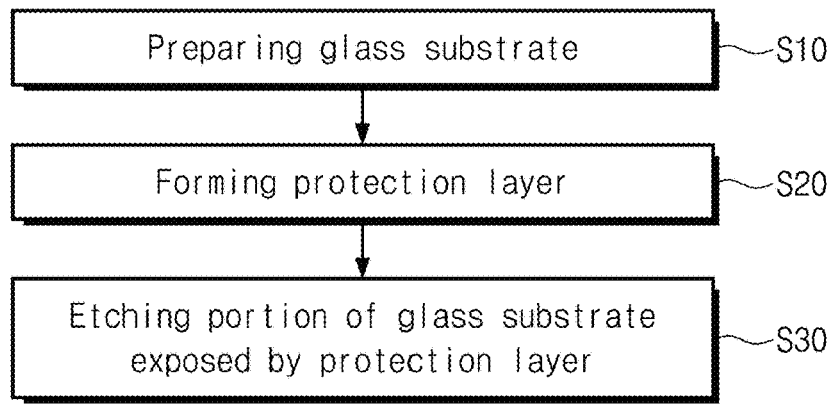
FIG. 10 is a flowchart schematically illustrating a method of fabricating a glass member, according to some embodiments of the inventive concept.
Figure 11:
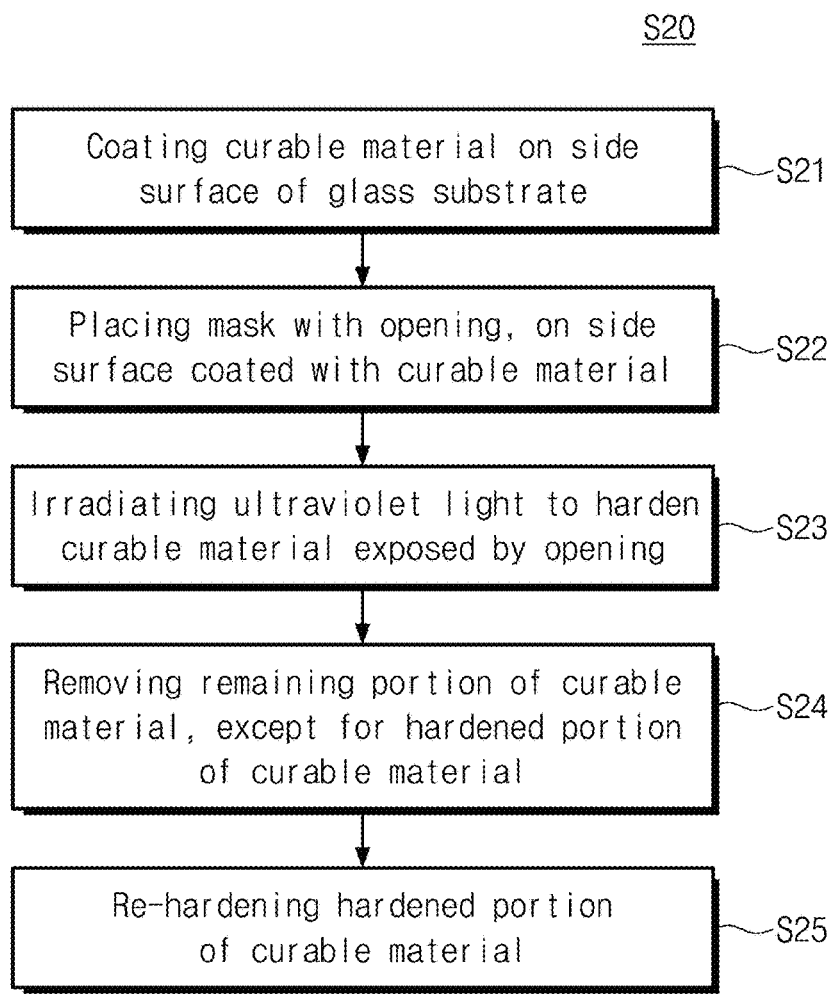
FIG. 11 is a flowchart illustrating a method of forming a protection layer in the method of FIG. 10, according to some embodiments of the inventive concept.

Herein, a method of fabricating a glass member according to some embodiments of the inventive concept will be described with reference to FIGS. 10 to 17. FIG. 10 is a flowchart schematically illustrating a method of fabricating a glass member, according to some embodiments of the inventive concept; FIG. 11 is a flowchart illustrating a task S20 of forming a protection layer, shown in FIG. 10, according to some embodiments of the inventive concept; and FIGS. 12 to 17 are schematic views illustrating a method of fabricating a glass member, according to some embodiments of the inventive concept.

According to some embodiments of the inventive concept, a method of fabricating a glass member may include preparing a glass substrate (in S10), forming a protection layer (in S20), and etching a portion of the glass substrate exposed by the protection layer (in S30).

In the preparing of the glass substrate (in S10), a substrate suitable for fabrication of a glass member may be used as the glass substrate. Any of various substrates used to fabricate a display device may be used as the glass substrate. For example, the glass substrate may be a substrate suitable for portable display devices, such as smart phones, or medium- or large-sized display devices, such as television sets, notebook computers, and monitors.

The glass substrate may be provided in the form of a plate and may include a first surface, a second surface facing the first surface, and a side surface connecting the first and second surfaces to each other. The glass substrate may have a rectangular shape, when viewed in a plan view, but the inventive concept is not limited to a specific shape or a specific size of the glass substrate.

In some embodiments, the glass substrate may be a cover glass that is provided on a display panel to protect a display device. However, the inventive concept is not limited thereto, and the glass substrate may be used for any of various purposes.

In some embodiments, in the method of fabricating a window member, the glass substrate may be fabricated by a float process. In some embodiments, the glass substrate may be fabricated by a down draw process or a fusion process. However, the inventive concept is not limited thereto, and the glass substrate may be fabricated by any of other processes that are not described herein.

In the forming of the protection layer (in S20), the protection layer may be formed to cover a portion of a side surface of the glass substrate. As shown in FIG. 11, the forming of the protection layer (in S20) may include coating a curable material on the side surface of the glass substrate (in S21), placing a mask with an opening on the side surface that is coated with the curable material (in S22), irradiating ultraviolet light to cure a portion of the curable material exposed by the opening (in S23), removing the remaining portion of the curable material, except for the cured portion of the curable material (in S24), re-curing the cured portion of the curable material (in S25), but the inventive concept is not limited thereto.

Figure 12:
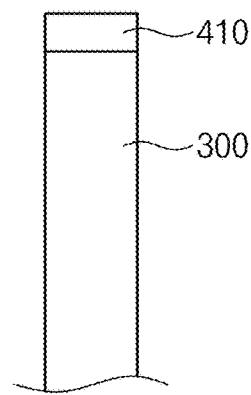
FIGS. 12 to 17 are schematic views illustrating a method of fabricating a glass member, according to some embodiments of the inventive concept.

FIG. 12 is a sectional view illustrating the task S21 of coating the curable material on the side surface of the glass substrate, shown in FIG. 11. A curable material 410 may be coated on the side surface of a glass substrate 300. In some embodiments, the curable material 410 may be coated by, for example, a jetting method, but the inventive concept is not limited thereto. In the jetting method, the curable material 410 may be sprayed in the form of small liquid droplets, and the use of the jetting method may make it possible to uniformly and precisely coat the curable material 410 on the side surface of the glass substrate 300.

The curable material 410 may be a material that does not react with an etching solution to be described below. For example, the curable material may be an acid-resistant material that does not react with strong acid or hydrofluoric acid. The curable material 410 may be an acrylic hardener, but the inventive concept is not limited thereto. The acrylic hardener may be an acrylic monomer, an acrylic oligomer, or a mixture of an acrylic monomer and an acrylic oligomer. In some embodiments, the curable material 410 may contain an acrylic monomer, an acrylic oligomer, a photoinitiator, and an additive agent. In some embodiments, the curable material 410 may contain an acrylic monomer (30-40 wt %), an acrylic oligomer (30-40 wt %), and a photoinitiator (20-30 wt %), but the inventive concept is not limited thereto. The acrylic monomer, the acrylic oligomer, the photoinitiator, and the additive agent may be the same as those described above, and, thus, further description thereof will be omitted.

Figure 13:
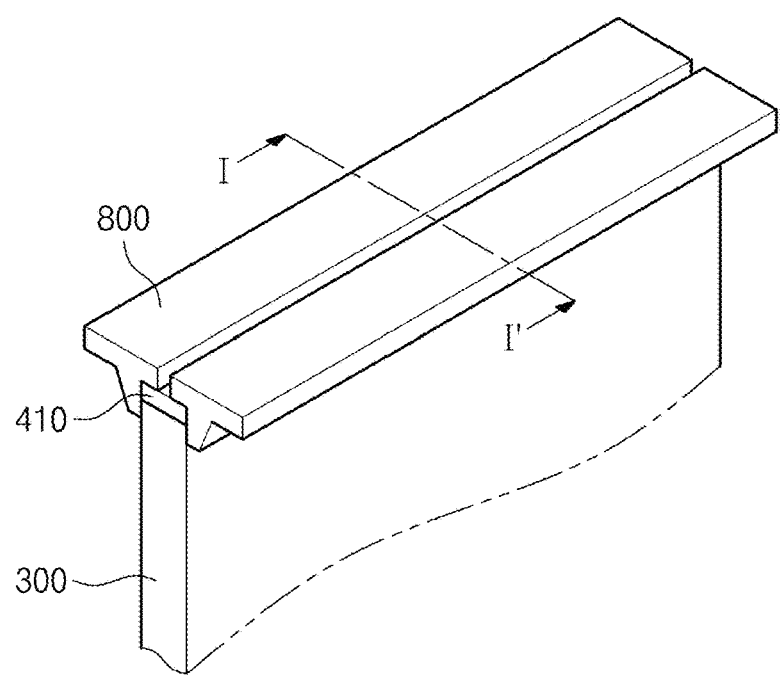
Figure 14:
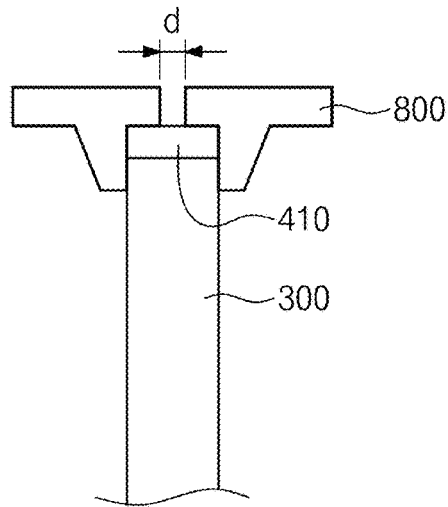

FIG. 13 is a perspective view illustrating the task S22 of placing a mask 800 with an opening on the side surface of the glass substrate 300; and FIG. 14 is a sectional view taken along the line I-I' of FIG. 13.

As shown in FIGS. 13 and 14, the method of fabricating a glass member may include placing the mask 800 with the opening on the side surface of the glass substrate 300 coated with the curable material 410 (in S22). Although there is no limitation on a shape and size of the mask 800, the mask 800 may be fastened to the side surface of the glass substrate 300 while covering the side surface of the glass substrate 300.

As will be described, a width d of the opening may determine a width d of the protection layer. The glass substrate 300 may have the same thickness as that of a protection layer 400, in an etching step of the glass substrate 300 to be described below. Accordingly, the width d of the opening may determine the thickness of the glass substrate. The glass substrate 300 may have a thickness in a range from 10 μm to 200 μm, and in the case in which the thickness of the glass substrate 300 is within the above range, the glass substrate 300 may be easily bent or deformed with a high degree of freedom and thus may be used to realize a flexible display device. To allow the glass substrate 300 to have the thickness of 10 μm to 200 μm, the width d of the opening may be substantially the same as the thickness of the glass substrate 300 (i.e. from 10 μm to 200 μm).

Figure 15:
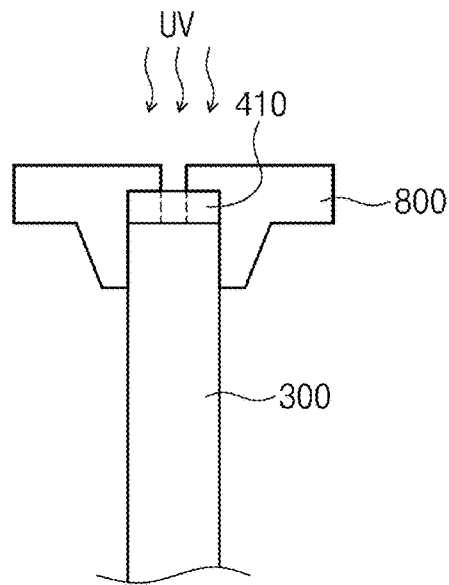

FIG. 15 is a sectional view illustrating the task S23 of irradiating ultraviolet light to cure a portion of the curable material 410 exposed by the opening, shown in FIG. 11. The portion of the curable material 410 exposed by the opening may be cured, and other portions of the curable material 410, which are not exposed by the mask 800, may not be cured.

Figure 16:
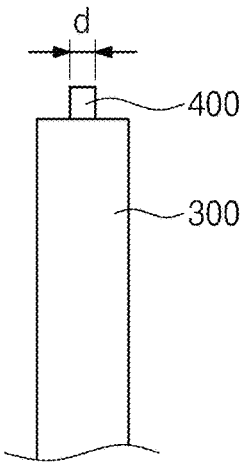

FIG. 16 is a sectional view illustrating the task S24 of removing the remaining portion of the curable material 410, except for the cured portion of the curable material 410, shown in FIG. 11. The uncured portion of the curable material 410 may be removed by a cleaning process using the mask, and the cleaning process may be performed, for example, using alcohol. However, the inventive concept is not limited to a specific material (e.g., alcohol) for the cleaning solution, and if a cleaning solution is used to remove the uncured portion of the curable material 410, it may also be used as the cleaning solution. The cured portion of the curable material 410 may be used as the protection layer 400, which is arranged on the side surface of the glass substrate 300 to absorb impact to be exerted on the glass substrate 300, thereby protecting the glass substrate 300 from the impact.

Referring back to FIG. 11, the fabrication of the glass member may include the task S25 of irradiating ultraviolet light to the cured portion of the curable material to re-cure the cured portion of the curable material. Here, the ultraviolet light in the re-curing step (in S25) may have a wavelength different from that of the ultraviolet light in the curing step (in S23), but the inventive concept is not limited thereto. In the case in which there is a difference in wavelength between the ultraviolet lights in the curing and re-curing steps (in S23 and S25), it may be possible to increase hardness and strength of the cured portion of the curable material.

Figure 17:
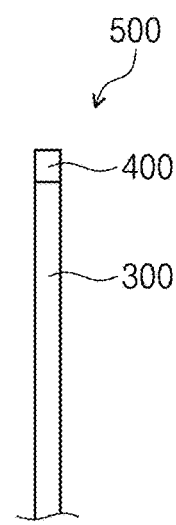
Figure 18:
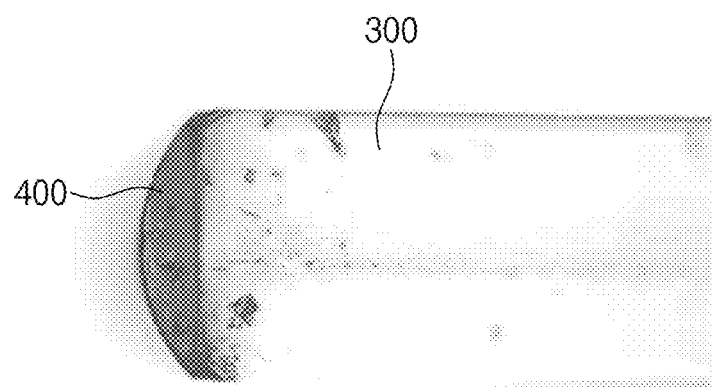
FIG. 18 is an image showing a glass member fabricated according to some embodiments of the inventive concept.

FIG. 17 is a sectional view illustrating the task S30 of etching a portion of the glass substrate 300, which is exposed by the protection layer 400, shown in FIG. 10. Although not shown, the glass substrate 300 provided with the protection layer 400 may be exposed to an etching solution, which may be provided by a spraying or dipping method. A portion of the glass substrate 300 exposed by the protection layer 400 may be etched by the etching solution. As a result, the glass substrate 300 may be thinned to have a thickness that is substantially equal to the width d of the protection layer 400, which is placed on the side surface of the glass substrate 300. Since the protection layer 400 protects the side surface of the glass substrate 300 in the etching step, the side surface of the glass substrate 300 may have a controlled shape. Accordingly, the glass member 500 may be formed to have a thickness in a range from 10 μm to 200 μm, and, in this case, the glass member 500 may be easily bent or deformed with a high degree of freedom and thus may be used to realize a flexible display device. FIG. 18 is an image showing a glass member fabricated according to some embodiments of the inventive concept. FIG. 18 exemplarily illustrates a glass member, which was formed to have a very small thickness of 100 μm, and a protection layer, which was placed on the side surface of the glass substrate.

Figure 19:
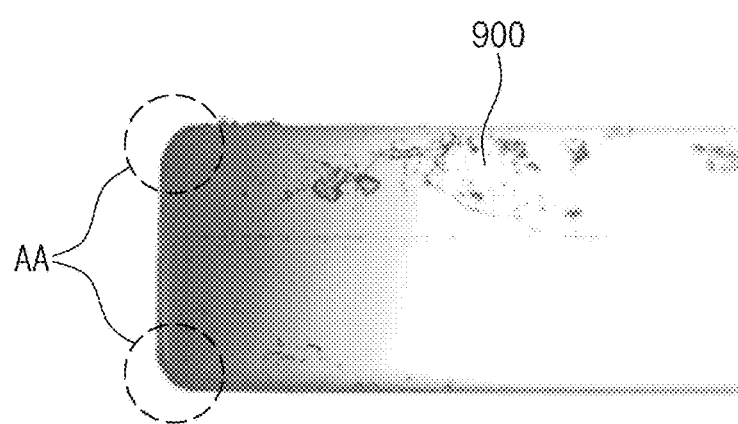
FIG. 19 is an image showing a glass member fabricated according to other embodiments of the inventive concept.

In some embodiments, a method of fabricating a glass member may further include removing the protection layer 400. In a case in which the removing of the protection layer 400 is further performed, the glass member may be formed to have a shape shown in FIG. 19. FIG. 19 is an image showing a glass member 900 fabricated according to other embodiments of the inventive concept. Although the glass member 900 shown in FIG. 19 has a very small thickness of 75 μm, a corner AA of the glass member 900 has a controlled shape (e.g., approximately with a right angle). In the case in which the corner of the glass member 900 has approximately a right-angled shape, it may be possible to improve durability or strength of the glass member 900 to an external impact, and, thus, it may be possible to reduce a risk of breakage of the glass member 900 and to more effectively protect internal functional layers.

Figure 20:
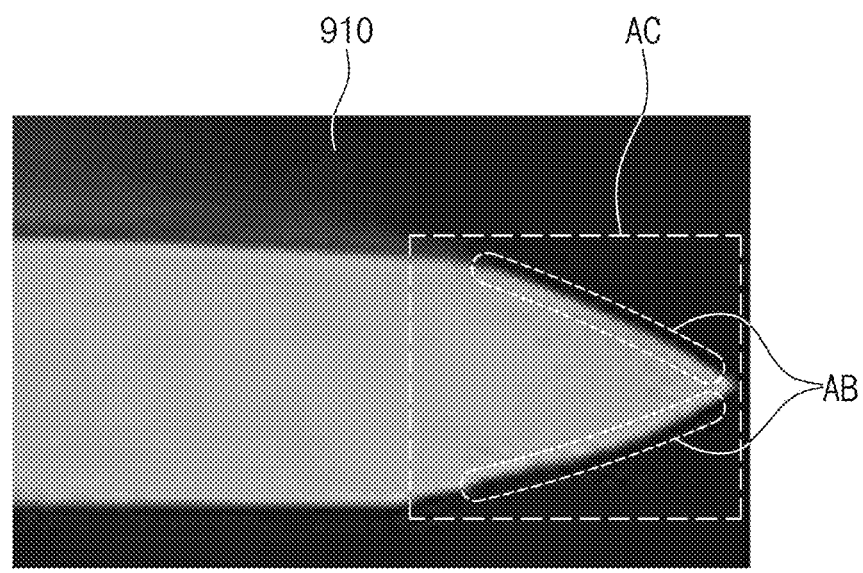
FIG. 20 is an image showing a glass member fabricated by a conventional method.

By contrast, FIG. 20 illustrates a glass member 910 which was fabricated by etching a glass substrate without the protection layer. Referring to FIG. 20, a corner AB of the glass member 910 has a gently inclined shape, not a right-angled shape, and, thus, a side surface AC of the glass member 910 has a sharp shape. In the case in which the side surface of the glass member has a sharp shape, the glass member may be easily broken by an external impact.

In the above embodiments, the protection layer has been described to be placed on one of the side surfaces of the glass substrate; however, in some embodiments, the protection layer may be placed on all or at least two of the side surfaces of the glass substrate in the same manner.

According to some embodiments of the inventive concept, a method of fabricating a display device may include forming a display panel, forming a touch panel on the display panel, forming a glass member, and combining the display panel, on which the touch panel is formed, to the glass member. The glass member may be fabricated by the process described with reference to FIGS. 10 and 11. The glass member fabricated by this process may be used a window structure of a display device.

According to some embodiments of the inventive concept, a method of fabricating a display device may include forming a display panel and forming a window structure on the display panel. The forming of the display panel may include forming a glass member and forming a pixel layer on the glass member. The glass member may be fabricated by the process described with reference to FIGS. 10 and 11. The glass member fabricated by this process may be used as a base substrate, on which thin-film transistors of the display panel are formed.

According to some embodiments of the inventive concept, a side surface of a glass member may have a controlled shape. This may make it possible to improve durability or strength of a glass member to an external impact, and a display device including the same.

While some example embodiments of the inventive concepts have been particularly shown and described, it will be understood by one of ordinary skill in the art that variations in form and detail may be made therein without departing from the spirit and scope of the inventive concepts as set forth in the attached claims.

What is claimed is:

1. A method of fabricating a glass member for a display device, the method comprising:
   preparing a glass substrate including a first surface, a second surface opposite the first surface, and a side surface connecting the first surface and the second surface;
   forming a protection layer on the side surface to cover a first portion of the side surface while exposing each of a second portion of the side surface that is between the first portion and the first surface and a third portion of the side surface that is between the first portion and the second surface; and
   etching a portion of the glass substrate exposed by the protection layer.

2. The method of claim 1, wherein the forming of the protection layer comprises:
   coating the side surface with a curable material;
   curing a portion of the curable material by irradiating ultraviolet light; and
   removing a remaining portion of the curable material, except for the cured portion of the curable material.

3. The method of claim 2, further comprising irradiating ultraviolet light to the cured portion of the curable material to re-cure the cured portion of the curable material.

4. The method of claim 2, wherein the curable material comprises 30-40 wt % of an acrylic monomer, 30-40 wt % of an acrylic oligomer, and 20-30 wt % of a photoinitiator.

5. The method of claim 1, further comprising removing the protection layer.

6. The method of claim 1, wherein the protection layer has a width from 10 μm to 200 μm, and the protection layer has a height from 10 μm to 100 μm.

7. The method of claim 1, wherein the glass substrate has a thickness from 10 μm to 200 μm.

8. A method of fabricating a glass member for a display device, the method comprising:
   preparing a glass substrate including a first surface, a second surface opposite the first surface, and a side surface connecting the first surface and the second surface;
   forming a protection layer on the side surface to cover a portion of the side surface; and
   etching a portion of the glass substrate exposed by the protection layer,
   wherein the forming of the protection layer comprises:
   coating the side surface with a curable material;
   curing a portion of the curable material by irradiating ultraviolet light; and
   removing a remaining portion of the curable material, except for the cured portion of the curable material, and
   wherein the curing of the portion of the curable material comprises:
   placing a mask having an opening on the side surface coated with the curable material; and
   irradiating the ultraviolet light to cure a portion of the curable material exposed by the opening.

9. The method of claim 8, wherein the opening has a width from 10 μm to 200 μm.

* * * * *